United States Patent
Fang et al.

(10) Patent No.: US 10,650,216 B2
(45) Date of Patent: May 12, 2020

(54) FINGERPRINT IDENTIFICATION SYSTEM

(71) Applicant: SHENZHEN GOODIX TECHNOLOGY CO., LTD., Guangdong (CN)

(72) Inventors: Hsin-Wen Fang, Taipei (TW); Yu-An Liang, Taipei (TW); Meng-Ta Yang, Taipei (TW)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 142 days.

(21) Appl. No.: 16/123,639

(22) Filed: Sep. 6, 2018

(65) Prior Publication Data

US 2019/0019001 A1    Jan. 17, 2019

Related U.S. Application Data

(63) Continuation of application No. PCT/CN2017/072524, filed on Jan. 24, 2017.

(51) Int. Cl.
*G06K 9/20* (2006.01)
*G06K 9/00* (2006.01)
*H03K 3/037* (2006.01)

(52) U.S. Cl.
CPC ......... *G06K 9/0004* (2013.01); *G06K 9/0002* (2013.01); *H03K 3/037* (2013.01)

(58) Field of Classification Search
CPC . G06K 9/00006–9/0012; H03K 3/037–3/0377
See application file for complete search history.

(56) References Cited

U.S. PATENT DOCUMENTS 9,151,792 B1   10/2015 Kremin et al.
2012/0146533 A1   6/2012 Park
(Continued)

FOREIGN PATENT DOCUMENTS

CN   1467914   1/2004
CN   1996753   7/2007
(Continued)

OTHER PUBLICATIONS

Search Report dated Mar. 6, 2019 by the European Patent Office for counterpart application 17894238.9.
(Continued)

*Primary Examiner* — Brian Werner
(74) *Attorney, Agent, or Firm* — WPAT, P.C., Intellectual Property Attorneys; Anthony King

(57) ABSTRACT

A fingerprint identification system includes: a fingerprint sensing circuit having a power supply terminal and a floating ground terminal, used for generating a first signal; and a signal generation circuit having a first output terminal and a second output terminal, wherein the first output terminal is coupled to the power supply terminal, and the second output terminal is coupled to the floating ground terminal, the signal generation circuit is used for generating a floating power signal to the power supply terminal according to the first signal, and for generating a floating ground signal to the floating ground terminal according to the first signal, wherein the floating power signal has a floating power amplitude, and the floating ground signal has a floating ground amplitude; and wherein the signal generation circuit has a breakdown voltage, and both the floating power amplitude and the floating ground amplitude are greater than the breakdown voltage.

16 Claims, 9 Drawing Sheets

(56) References Cited

U.S. PATENT DOCUMENTS

| | | | |
|---|---|---|---|
| 2012/0154014 A1 | 6/2012 | Nakashima | |
| 2016/0350577 A1 | 12/2016 | Yang et al. | |
| 2018/0005001 A1* | 1/2018 | Nilsson | G01D 5/24 |
| 2018/0060640 A1* | 3/2018 | Mrazek | G06K 9/00033 |

FOREIGN PATENT DOCUMENTS

| | | |
|---|---|---|
| CN | 101989855 | 3/2011 |
| CN | 102571067 | 7/2012 |
| CN | 104573649 | 4/2015 |
| CN | 105335737 A1 | 2/2016 |
| CN | 205490115 | 8/2016 |
| WO | 0101330 | 1/2001 |

OTHER PUBLICATIONS

English Abstract Translation of Foreign Document No. CN105335737A1.
English abstract translation of CN104573649.
English abstract translation of CN205490115.
English abstract translation of CN1467914.
English abstract translation of CN1996753.
English abstract translation of CN101989855.
English abstract translation of CN102571067.
International Search Report of PCT/CN2017/072524.
English International Search Report of PCT/CN2017/072524.
Written Opinion of PCT/CN2017/072524.
SIPO's Office Action of application No. 201780000062.4.
Fan Tao, et al., Design of new level shifter, Journal of university of electronic science and technology of china, Jan. 30, 2011, pp. 138-141, vol. 40, No. 1.
S.Vaishnavi, et al., Design and analysis of level shifter in high voltage transmitter, Internal journal of scientific and research publication, Jan. 31, 2014, pp. 1-5, vol. 4, issue 1.

* cited by examiner

FINGERPRINT IDENTIFICATION SYSTEM

CROSS-REFERENCE TO RELATED APPLICATION

This application is a continuation of international application PCT/CN2017/072524, filed on Jan. 24, 2017, which is incorporated by reference in its entirety.

FIELD

The present disclosure relates to a fingerprint identification system, and in particular to a fingerprint identification system which is capable of generating a high-voltage signal.

BACKGROUND

With the rapid development in science and technology, more and more portable electronic devices such as mobile phones, digital cameras, tablet computers, and notebook computers or the like have become essential tools in people's lives. Since portable electronic devices are generally used by individuals and have certain privacy, data stored inside the electronic devices (such as phone books, photos, personal information) is privately owned. Once the electronic device is lost, the data may be used by others, causing unnecessary losses. Although password protection has been used to prevent the electronic device from being used by others, passwords may be easily leaked or cracked, thus having a low degree of security. Moreover, the user has to remember the passwords so that the electronic device can be used. If the passwords are forgotten, a lot of inconveniences are brought to the user. Therefore, a personal fingerprint identification system has been developed for the purpose of identity verification so as to improve data security.

For a fingerprint identification system, a square wave signal having a high-voltage amplitude is used to enhance the fingerprint signal. However, in order to generate the high-voltage square wave signal, a semiconductor component having a high breakdown voltage is produced by using a high-voltage semiconductor process, and a signal generation circuit thereof is formed by using the semiconductor component having a high breakdown voltage. However, the high-voltage semiconductor process involves high production cost, which leads to an increase in the production cost of the electronic products of a circuit system for fingerprint identification.

Therefore, how to use a semiconductor component manufactured by using a low-voltage process to generate a square wave with a high-voltage amplitude is one of the goals to be achieved in the industry.

SUMMARY OF THE INVENTION

Therefore, a main object of some embodiments of the present disclosure is to provide a fingerprint identification system manufactured by using a low-voltage process and can generate high-voltage signals.

In order to solve the above issues, the present disclosure provides a fingerprint identification system, including: a fingerprint sensing circuit, having a power supply terminal and a floating ground terminal, the fingerprint sensing circuit being used for generating a fingerprint signal and a first signal, wherein the fingerprint identification system identifies a fingerprint according to the fingerprint signal; and a signal generation circuit, having a first output terminal and a second output terminal, wherein the first output terminal is coupled to the power supply terminal, and the second output terminal is coupled to the floating ground terminal, and the signal generation circuit is used for generating a floating power signal to the power supply terminal according to the first signal, and for generating a floating ground signal to the floating ground terminal according to the first signal, wherein the floating power signal has a floating power amplitude, and the floating ground signal has a floating ground amplitude; wherein the signal generation circuit has a breakdown voltage, and both the floating power amplitude and the floating ground amplitude are greater than the breakdown voltage.

For instance, the signal generation circuit includes: an amplitude reduction circuit, coupled to the fingerprint sensing circuit, the amplitude reduction circuit being used for generating a second signal according to the first signal, wherein the first signal has a first amplitude, the second signal has a second amplitude, the second amplitude is less than the first amplitude, and the second amplitude is less than or equal to the breakdown voltage.

For instance, the signal generation circuit further includes: a first level shifter circuit, coupled to the amplitude reduction circuit, the first level shifter circuit being used for translating the second signal by a first translation amount to generate a first control signal; a second level shifter circuit, coupled to the amplitude reduction circuit, the second level shifter circuit being used for translating the second signal by a second translation amount to generate a second control signal; a first switch module, a terminal of the first switch module is used for receiving a first voltage, and another terminal of the first switch module is coupled to the first output terminal, wherein the first switch module is controlled by the first control signal; a second switch module, a terminal of the second switch module is used for receiving a second voltage, and another terminal of the second switch module is coupled to the second output terminal, wherein the second switch module is controlled by the second control signal; a third switch module, a terminal of the third switch module is used for receiving a third voltage, and another terminal of the third switch module is coupled to the second output terminal, wherein the third switch module is controlled by a third control signal; and a capacitor, coupled between the first output terminal and the second output terminal; wherein the third control signal is dependent from the second signal.

For instance, the signal generation circuit further includes: a third level shifter circuit, coupled to the amplitude reduction circuit, the third level shifter circuit being used for generating the third control signal according to the second signal.

For instance, the second signal has a low electrical potential the same as a low electrical potential of the first signal.

For instance, amplitudes of the first control signal, the second control signal and the third control signal are the same as the second amplitude.

For instance, at a first time point, the first switch module and the second switch module are turned on, and the floating power signal output by the first output terminal is the first voltage, the floating ground signal output by the second output terminal is the second voltage; and in a second time point, the third switch module is turned on, and the floating ground signal output by the second output terminal is the third voltage.

For instance, the third voltage is negative two times the first voltage, and the second voltage is a ground voltage.

For instance, the amplitude reduction circuit includes: a plurality of transistors, serially connected into a transistor sequence, wherein a first terminal of the transistor sequence is used for receiving the first signal, and a second terminal of the transistor sequence is used for outputting the second signal; and a resistor, coupled to the second terminal of the transistor sequence.

For instance, the amplitude reduction circuit includes: a plurality of diodes, serially connected into a diode sequence, wherein a first terminal of the diode sequence is used for receiving the first signal, and a second terminal of the diode sequence is used for outputting the second signal; and a resistor, coupled to the second terminal of the diode sequence.

For instance, the first level shifter circuit includes a first voltage level shifter unit and a second voltage level shifter unit, the first voltage level shifter unit is used for translating the second signal upward by a third translation amount to generate a third signal, and the second voltage level shifter unit is used for translating the third signal upward by the third translation amount, and the third translation amount is identical to the second amplitude.

For instance, the second level shifter circuit includes a third voltage level shifter unit, the third voltage level shifter unit is used for translating the second signal upward by the second translation amount, and the second translation amount is identical to the second amplitude.

For instance, the second level shifter circuit further includes a first dummy level shifter unit coupled to the third voltage level shifter unit.

For instance, the third level shifter circuit includes a second dummy level shifter unit and a third dummy level shifter unit, the second dummy level shifter unit is used for receiving the second signal, the third dummy level shifter unit is used for outputting the third control signal, the second signal has the same high electrical potential as that of the third control signal, and the second signal has the same low electrical potential as that of the third control signal.

For instance, the first signal is the floating power signal at a first time point, and the first signal is the floating ground signal at a second time point.

For instance, a fixed voltage difference is between the floating power signal and the floating ground signal.

A signal generation circuit of the present disclosure which is produced by using a low-voltage process can be used for generating a floating power signal having a high-voltage amplitude and a floating ground signal having a high-voltage amplitude to increase the intensity of the fingerprint signal. As compared with the prior art, the present disclosure has the advantage of reducing the production cost.

BRIEF DESCRIPTION OF THE DRAWINGS

One or more embodiments are exemplarily illustrated in combination with the respective figures in the accompanying drawings, and the exemplary illustration should not be construed as limiting the embodiments. Elements having the same reference numerals in the drawings are similar elements, unless specifically stated otherwise, and the figures in the accompanying drawings are not drawn to scale.

DETAILED DESCRIPTION OF THE EMBODIMENT(S) OF THE INVENTION

In order to make the objects, technical solutions and advantages of the disclosure clearer and more apparent, the disclosure will be further described below in detail with reference to the embodiments and the accompanying drawings. It should be noted that the specific embodiments described herein are merely used to explain the disclosure, and are not intended to limit the disclosure.

Figure 1:
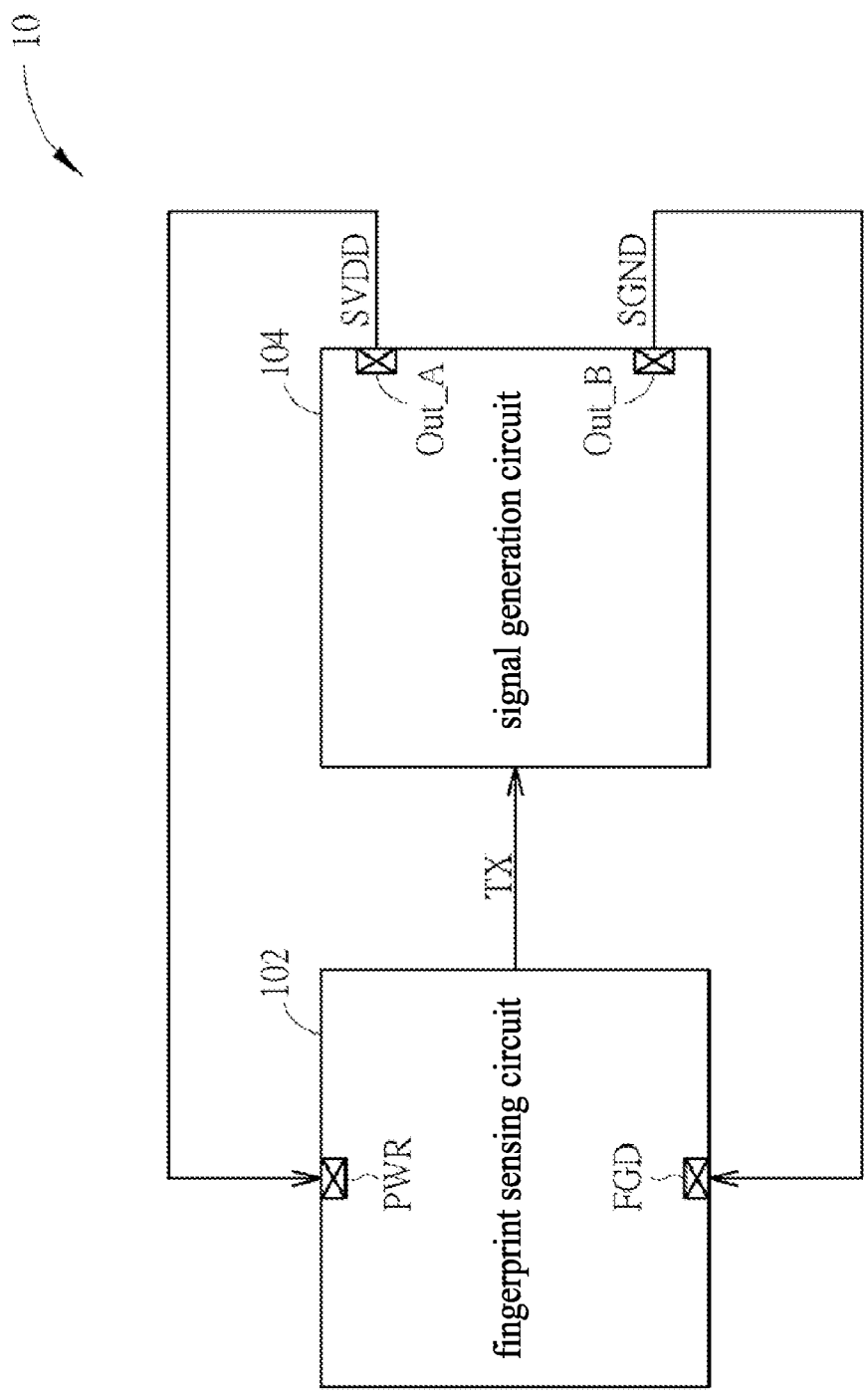
FIG. 1 is a schematic diagram of a fingerprint identification system according to an embodiment of the present disclosure.

Reference is made to FIG. 1, which is a schematic diagram of a fingerprint identification system 10 according to an embodiment of the present disclosure. The fingerprint identification system 10 includes a fingerprint sensing circuit 102 and a signal generation circuit 104. A fingerprint signal may be generated by the fingerprint sensing circuit 102, and a fingerprint is determined by the fingerprint identification system 10 according to the fingerprint signal. In order to enhance the fingerprint signal, a floating power signal SVDD having a floating power amplitude and a floating ground signal SGND having a floating ground amplitude may be received by the fingerprint sensing circuit 102, and the intensity of the fingerprint signal is related to the floating power amplitude/the floating ground amplitude. That is, the greater the floating power amplitude or the floating ground amplitude is, the more significant the fingerprint signal will be. The signal generation circuit 104 is used for generating the floating power signal SVDD having a large floating power amplitude and the floating ground signal SGND having a large floating ground amplitude and for transmitting them to the fingerprint sensing circuit 102. Specifically, the fingerprint sensing circuit 102 has a power supply terminal PWR and a floating ground FGD, and the signal generation circuit 104 has an output terminal Out_A and an output terminal Out_B. The output terminal Out_A is used for outputting the floating power signal SVDD generated by the signal generation circuit 104 to the power supply terminal PWR, and the output terminal Out_A is used for outputting the floating ground signal SGND generated by the signal generation circuit 104 to the floating ground terminal FGD.

It should be noted that the signal generation circuit 104 is a circuit manufactured by using a low-voltage process and has a breakdown voltage BV. In other words, if the voltage across the signal generation circuit 104 exceeds the breakdown voltage BV, the semiconductor component inside the signal generation circuit 104 will break down, and the signal generation circuit 104 will be damaged. Under the premise that the signal generation circuit 104 has a breakdown voltage BV, the signal generation circuit 104 can generate the floating power signal SVDD whose floating power amplitude is greater than the breakdown voltage BV and the floating ground signal SGND whose floating ground amplitude is greater than the breakdown voltage BV. Typically, the breakdown voltage BV of the semiconductor component inside the signal generation circuit 104 is slightly greater than (or equal to) a voltage AVDD.

Further, an signal stimulus TX may be generated by the fingerprint sensing circuit 102 to the signal generation circuit 104, and the floating power signal SVDD and the floating ground signal SGND may be generated by the signal generation circuit 104 according to the signal stimulus TX. For example, reference is made to FIG. 2, which includes waveform diagrams of the signal stimulus TX, the floating power signal SVDD, and the floating ground signal SGND according to an embodiment of the present disclosure. As can be seen from FIG. 2, both the floating power signal SVDD and the floating ground signal SGND are square waves, a high electrical potential of the floating power signal SVDD is a voltage AVDD, and a low electrical potential of the floating power signal SVDD is a negative voltage −AVDD; a high electrical potential of the floating ground signal SGND is a ground voltage GND, and a low electrical potential of the floating ground signal SGND is a twice negative voltage −2AVDD (i.e., negative two times the voltage AVDD). In a first time interval, a high electrical potential of the signal stimulus TX may be generated by the fingerprint sensing circuit 102 as the high electrical potential of the floating power signal SVDD (i.e., the voltage AVDD); in a second time interval, a low electrical potential of the signal stimulus TX may be generated by the fingerprint sensing circuit 102 as the low electrical potential of the floating ground signal SGND (i.e., the twice negative voltage −2AVDD). In addition, there is a fixed voltage difference between the floating ground signal SGND and the floating ground signal SGND, i.e., AVDD.

Figure 2:
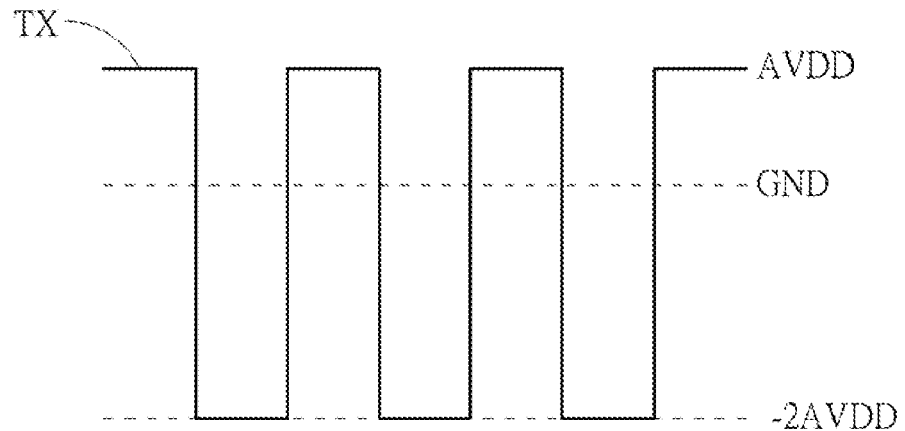
FIG. 2 is diagram illustrating a plurality of signal waveforms according to an embodiment of the present disclosure.
Figure 2:
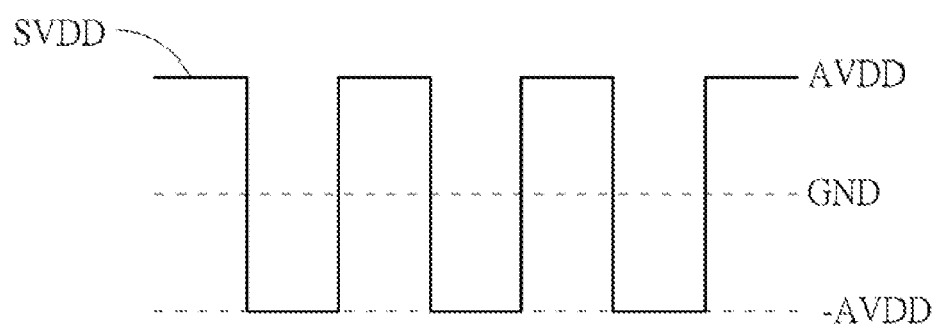
Figure 2:
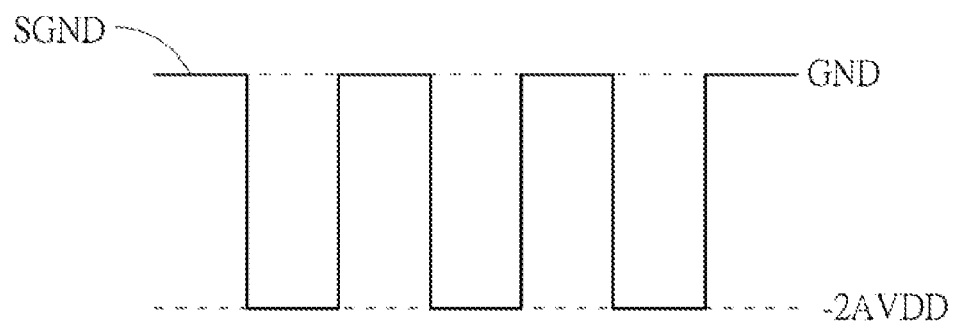

On the other hand, as can be seen from FIG. 2, the floating power amplitude of the floating power signal SVDD is 2AVDD (i.e., two times the voltage AVDD), and the floating ground amplitude of the floating ground signal SGND is also 2AVDD. That is, both the floating power amplitude of the floating power signal SVDD and the floating amplitude of the floating ground signal SGND are greater than the breakdown voltage BV of the semiconductor component inside the signal generation circuit 104. In other words, a high-voltage signal can be generated using a low-voltage component in the present disclosure. More specifically, in the disclosure, the signal generation circuit 104 whose component breakdown voltage BV is merely slightly greater than (or equal to) the voltage AVDD can be used to generate the floating power signal SVDD and the floating ground signal SGND each having an amplitude of two times the voltage AVDD.

Figure 3:
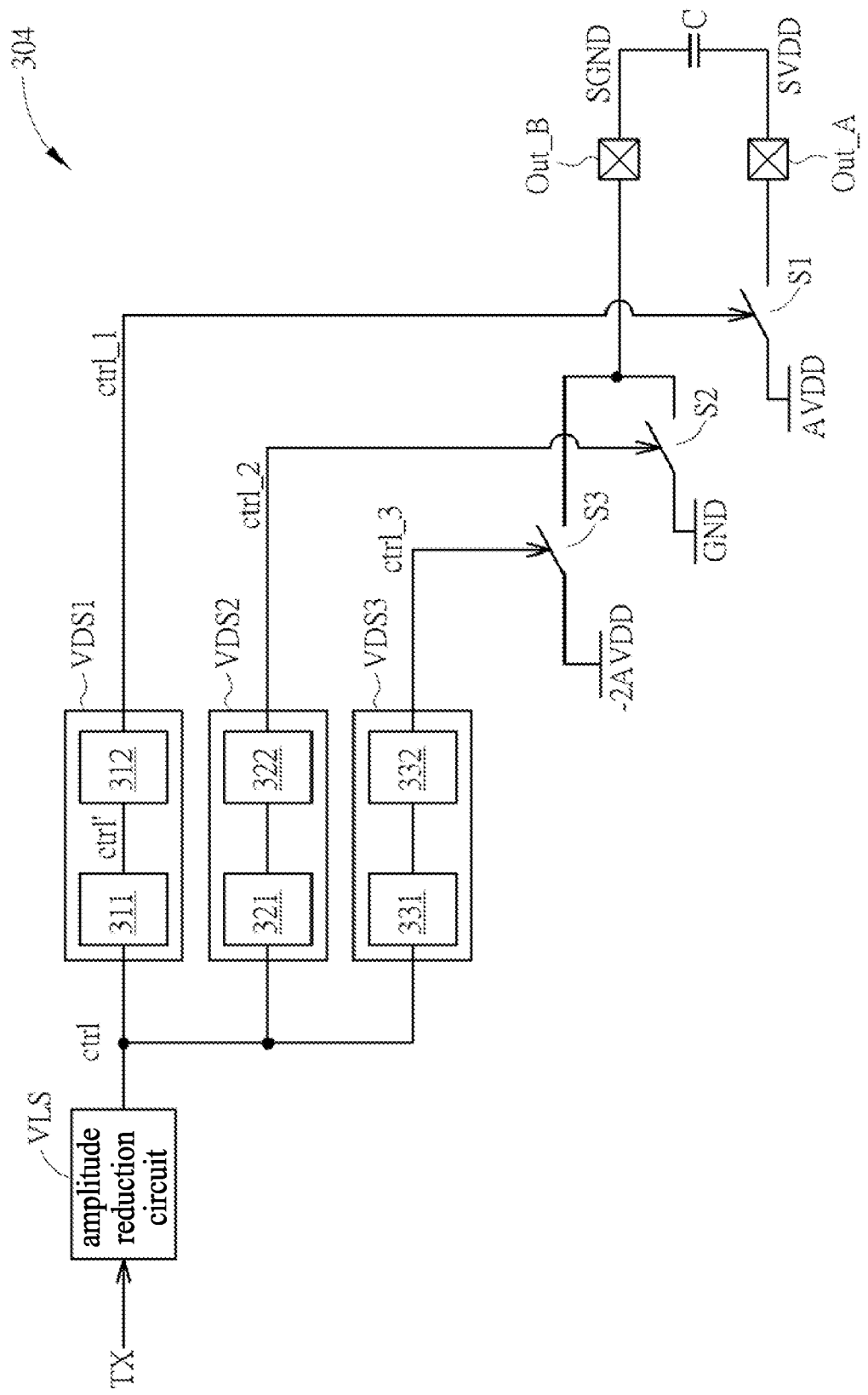
FIG. 3 is a schematic diagram of a signal generation circuit according to an embodiment of the present disclosure.

Reference to FIG. 3, which is a schematic diagram of a signal generation circuit 304 according to an embodiment of the present disclosure. The signal generation circuit 304 may be used to implement the signal generation circuit 104, which is a circuit manufactured by using a low-voltage process and has a breakdown voltage BV slightly greater than or equal to the voltage AVDD. The signal generation circuit 304 includes an amplitude reduction circuit VLS, a first level shifter circuit VDS1, a second level shifter circuit VDS2, a third level shifter circuit VDS3, and a first switch module S1, a second switch module S2, a third switch module S3, and a capacitor C. The capacitor C is coupled between an output terminal Out_A and an output terminal Out_B of the signal generation circuit 304. The amplitude reduction circuit VLS is coupled to the fingerprint sensing circuit 102 to receive the signal stimulus TX, and is used for reducing the amplitude of the signal stimulus TX (which is 3AVDD, i.e., three times the voltage AVDD) to the voltage AVDD to generate an initial control signal ctrl. An amplitude of the initial control signal ctrl is the voltage AVDD, a low electrical potential of the initial control signal ctrl is identical to a low electrical potential of the signal stimulus TX (both are −2AVDD), and a high electrical potential of the initial control signal ctrl is −AVDD.

Figure 4:
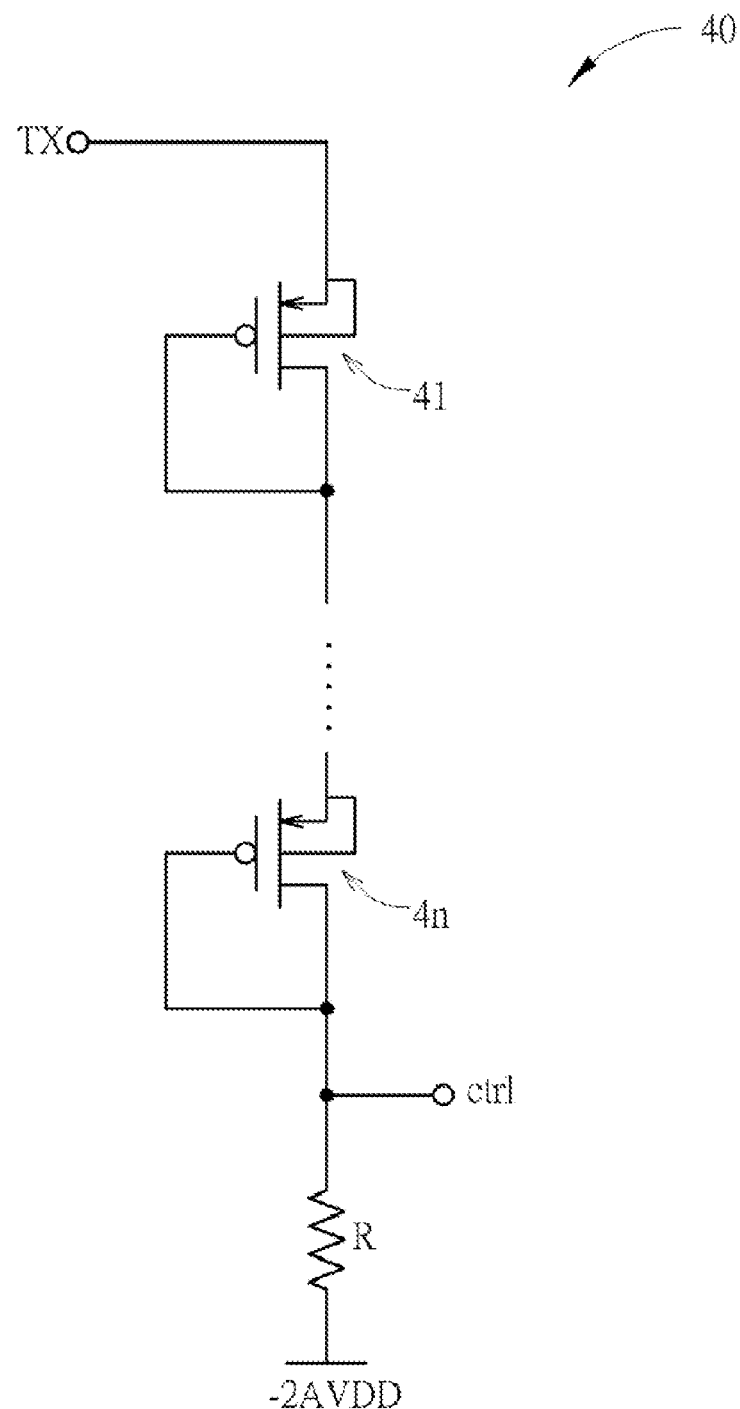
FIG. 4 is a schematic diagram of an amplitude reduction circuit according to an embodiment of the present disclosure.

In addition, the amplitude reduction circuit VLS is not limited to being implemented by a specific circuit configuration. For example, reference is made to FIG. 4, which is a schematic diagram of an amplitude reduction circuit 40 according to an embodiment of the present disclosure. The amplitude reduction circuit 40 may be used to implement the amplitude reduction circuit VLS. The amplitude reduction circuit 40 includes transistors 41 to 4n and a resistor R. Gates of the transistors 41 to 4n are connected to sources of the transistors 41 to 4n, respectively. The transistors 41 to 4n are serially connected into a transistor sequence. A first terminal of the transistor sequence is used for receiving the signal stimulus TX, and a second terminal of the transistor sequence is used for outputting the initial control signal ctrl. One terminal of the resistor R is coupled to the second terminal of the transistor sequence, and the other terminal of the resistor R is used for receiving the twice negative voltage −2AVDD. In a case that the signal stimulus TX is at a high electrical potential (the voltage AVDD), the transistors 41 to 4n are turned on/ON, and the initial control signal ctrl output from the amplitude reduction circuit 40 is a negative voltage −AVDD. In a case that the signal stimulus TX is at a low electrical potential (the twice negative voltage −2AVDD), the transistors 41 to 4n are turned off/OFF, and the initial control signal ctrl output from the amplitude reduction circuit 40 is the twice negative voltage −2AVDD.

Figure 5:
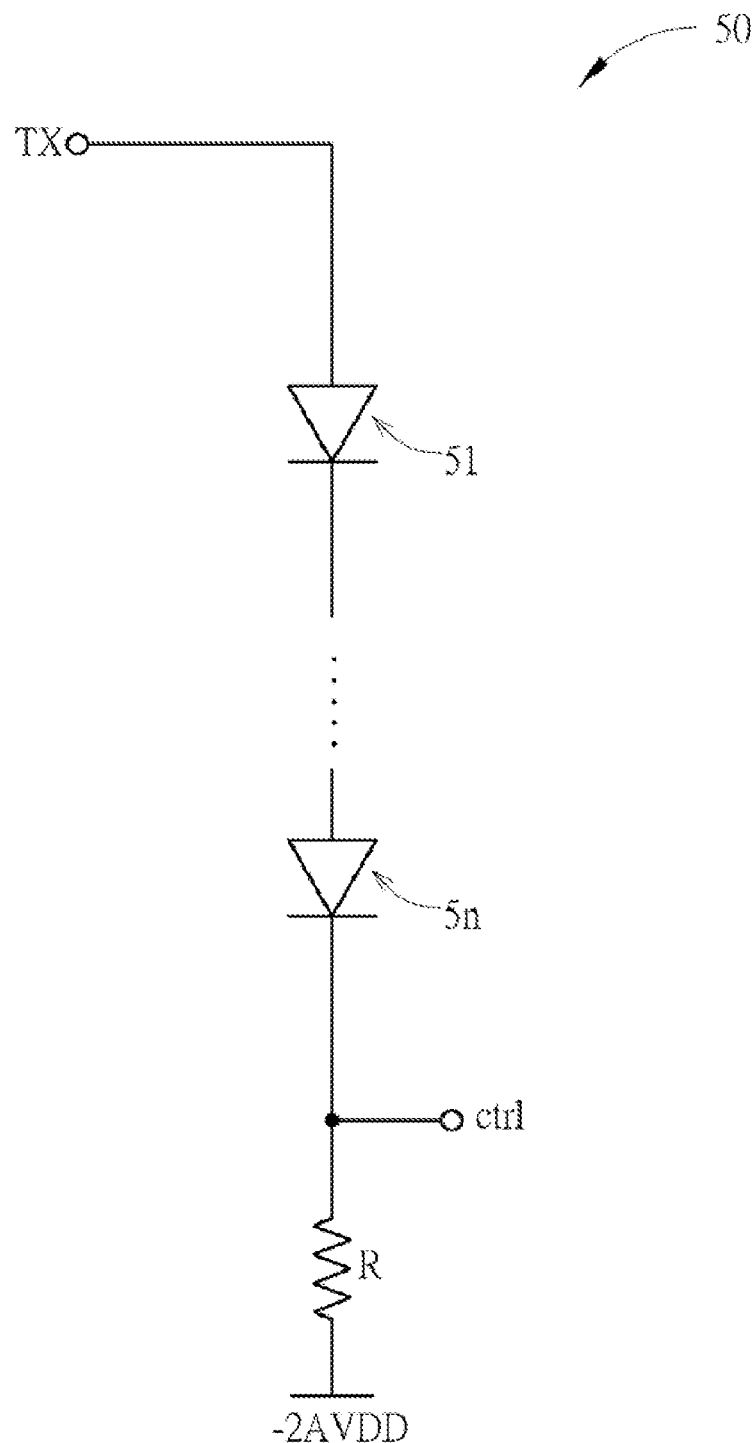
FIG. 5 is a schematic diagram of an amplitude reduction circuit according to an embodiment of the present disclosure.

Additionally, reference is made to FIG. 5, which is a schematic diagram of an amplitude reduction circuit 50 according to an embodiment of the present disclosure. The amplitude reduction circuit 50 may be used to implement an amplitude reduction circuit VLS. The amplitude reduction circuit 50 is similar to the amplitude reduction circuit 40, and it differs from the amplitude reduction circuit 40 in that the amplitude reduction circuit 50 includes diodes 51 to 5n, wherein the diodes 51 to 5n are serially connected into a diode sequence, a first terminal of the diode sequence is used for receiving the signal stimulus TX, and a second terminal of the diode sequence is used for outputting the initial control signal ctrl. The operation principle of the amplitude reduction circuit 50 is similar to that of the amplitude reduction circuit 40, and is therefore not repeated herein.

In addition, the first level shifter circuit VDS1, the second level shifter circuit VDS2 and the third level shifter circuit VDS3 are all coupled to the amplitude reduction circuit VLS, which are used for translating the initial control signal ctrl upward by a translation amount $\Delta V1$, a translation amount $\Delta V2$, and a translation amount $\Delta V3$ to generate a first control signal ctrl_1, a second control signal ctrl_2, and a third control signal ctrl_3, respectively. The amplitudes of the first control signal ctrl_1, the second control signal ctrl_2 and the third control signal ctrl_3 are all the same as the amplitude of the initial control signal ctrl (all of which are the voltage AVDD). In an embodiment, the translation amount $\Delta V1$ may be a twice voltage 2AVDD (i.e., two times the voltage AVDD), the translation amount ΔV2 may be the voltage AVDD, and the translation amount ΔV3 may be 0 (that is, the voltage level of the initial control signal ctrl is not shifted by the third level shifter circuit VDS3).

Figure 9:
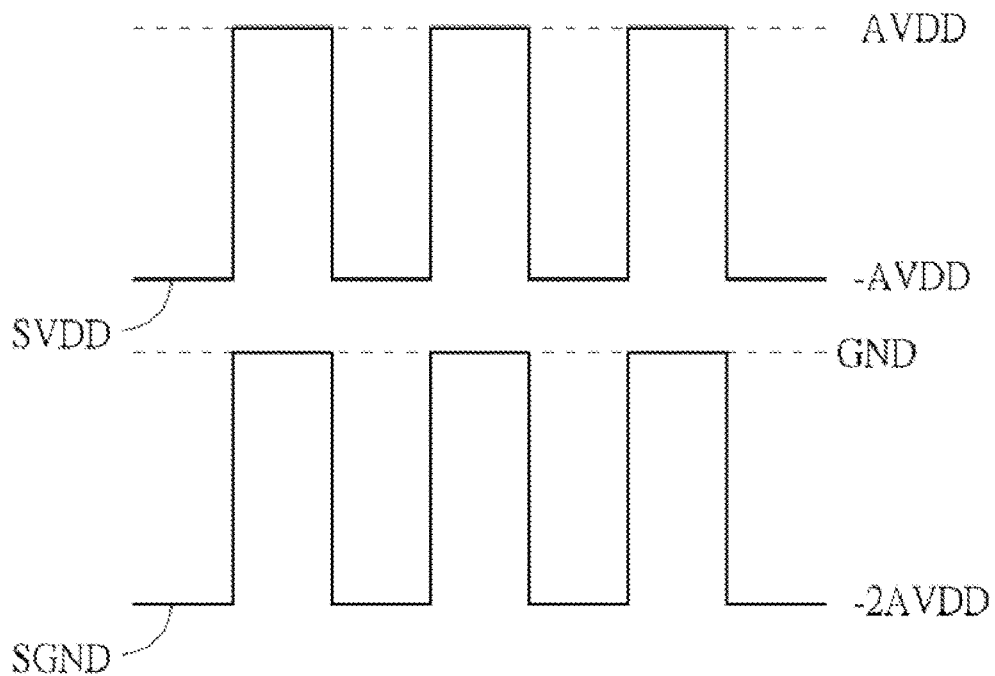
FIG. 9 is a diagram illustrating a plurality of signal waveforms according to an embodiment of the present disclosure.
Figure 9:
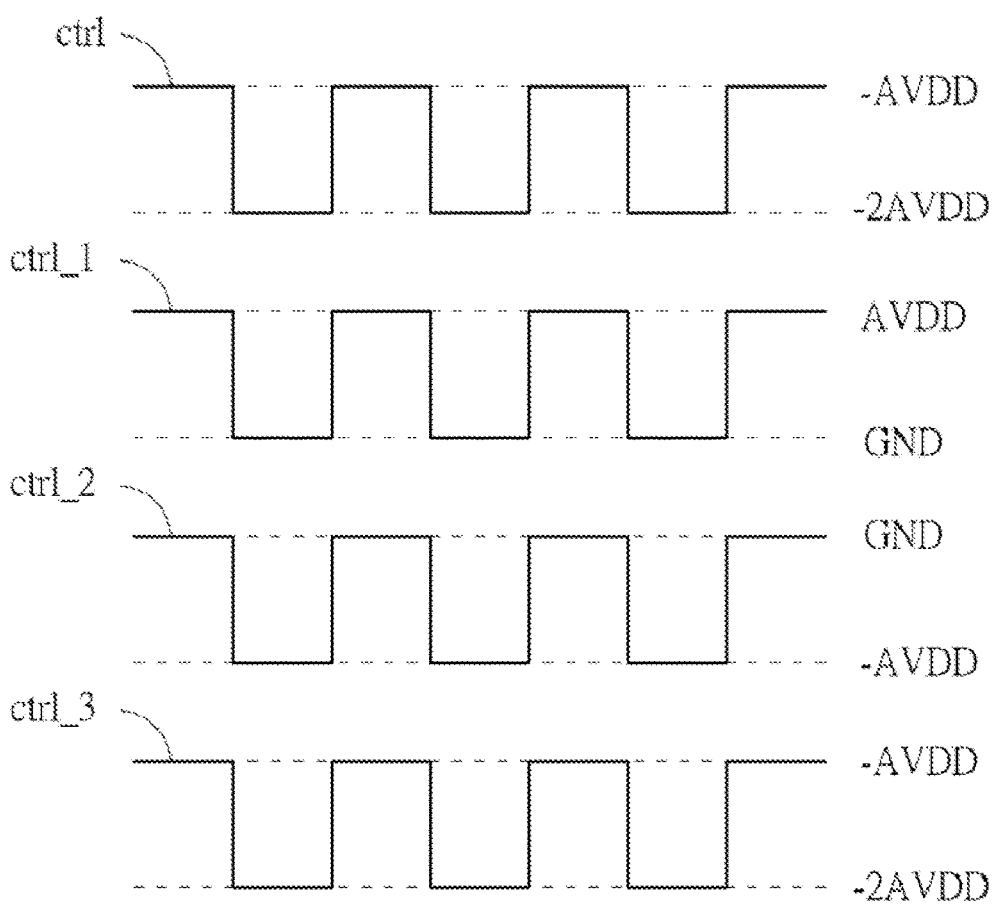

Reference is made to FIG. 9, which is waveform diagrams of the initial control signal ctrl, the first control signal ctrl_1, the second control signal ctrl_2 and the third control signal ctrl_3 according to an embodiment of the present disclosure. As can be seen from FIG. 9, the initial control signal ctrl is a square wave with a low electrical potential of −2AVDD and a high electrical potential of −AVDD, the first control signal ctrl_1 is a square wave with a low electrical potential of the ground voltage GND and a high electrical potential of the voltage AVDD, the second control signal ctrl_2 is a square wave with a low electrical potential of −AVDD and a high electrical potential of the ground voltage GND, and the third control signal ctrl_3 is a square wave also with a low electrical potential of −2AVDD and a high electrical potential of −AVDD.

In addition, the first switch module S1, the second switch module S2, and the third switch module S3 can be respectively controlled by the first control signal ctrl_1, the second control signal ctrl_2, and the third control signal ctrl_3. By means of the control signals ctrl_1, ctrl_2, ctrl_3 and the switch modules S1, S2, S3, the floating power signal SVDD and the floating ground signal SGND can be generated by the signal generation circuit 304. One terminal of the first switch module S1 is used for receiving the voltage AVDD, and the other terminal of the first switch module S1 is coupled to the output terminal Out_A of the signal generation circuit 304. One terminal of the second switch module S2 is used for receiving the ground voltage GND, and the other terminal of the second switch module S2 is coupled to the output terminal Out_B of the signal generation circuit 304. One terminal of the third switch module S3 is used for receiving the twice negative voltage −2AVDD, and the other terminal of the third switch module S3 is coupled to the output terminal Out_B of the signal generation circuit 304.

There is no limitation on the manner in which the switch modules S1, S2, and S3 are respectively controlled by the control signals ctrl_1, ctrl_2, and ctrl_3 to generate the floating power signal SVDD and the floating ground signal SGND. For example, in a case that the control signals ctrl_1, ctrl_2, and ctrl_3 are all at low electrical potentials, the first control signal ctrl_1 is the ground voltage GND, the second control signal ctrl_2 is a negative voltage −AVDD, and the third control signal ctrl_3 is a twice negative voltage −2AVDD. The first switch module S1 and the second switch module S2 are turned on/ON, the third switch module S3 is turned off/OFF, the floating power signal SVDD output from the output terminal Out_A of the signal generation circuit 304 is the voltage AVDD, which corresponds to the high electrical potential of the floating power signal SVDD, and the floating ground signal SGND output from the output terminal Out_B of the signal generation circuit 304 is the ground voltage GND, which corresponds to the high electrical potential of the floating ground signal SGND. On the other hand, in a case that the control signals ctrl_1, ctrl_2, and ctrl_3 are all at high electrical potentials, the first control signal ctrl_1 is the voltage AVDD, the second control signal ctrl_2 is the ground voltage GND, and the third control signal ctrl_3 is a negative voltage −AVDD. The first switch module S1 and the second switch module S2 are turned off/OFF, the third switch module S3 is turned on/ON, and the floating ground signal SGND output from the output terminal Out_B of the signal generation circuit 304 is the twice negative voltage −2AVDD. Additionally, a fixed voltage difference between the output terminal Out_A and the output terminal Out_B can be maintained by the capacitor C between the output terminal Out_A and the output terminal Out_B. When the floating ground signal SGND is instantaneously dropped from its high electrical potential (the ground voltage GND) to its low electrical potential (the twice negative voltage −2AVDD), the electrical potential of the output terminal Out_B is instantaneously dropped by 2AVDD. At this point, the electrical potential of the output terminal Out_A is also pulled down by 2AVDD by the capacitor C, that is, the floating power supply signal SVDD is dropped from its high electrical potential (the voltage AVDD) to its low electrical potential (the negative voltage −AVDD) by 2AVDD. As a result, the floating power signal SVDD and the floating ground signal SGND as shown in FIG. 2 can be generated by the signal generation circuit 304.

In addition, the first level shifter circuit VDS1, the second level shifter circuit VDS2, and the third level shifter circuit VDS3 are not limited to being implemented by specific circuit configurations. For example, the first level shifter circuit VDS1 may include voltage level shifter units 311 and 312, the second level shifter circuit VDS2 may include a voltage level shifter unit 321 and a dummy level shifter unit 322, and the third level shifter circuit VDS3 may include dummy level shifter units 331, 332. The input signals of the voltage level shifter units 311, 312, 321 may be translated by a translation amount ΔV, the levels of the input signals of the dummy level shifter units 322, 331, 332 may be maintained, and the translation amount ΔV may be a voltage AVDD. In other words, the voltage level shifter unit 311 can translate the initial control signal ctrl upward by the translation amount ΔV (i.e., the voltage AVDD) to generate a signal ctrl', and then the voltage level shifter unit 312 can translate the signal ctrl' further upward by the translation amount ΔV (ΔV1=2ΔV) to generate the first control signal ctrl_1. Similarly, the voltage level shifter unit 321 can translate the initial control signal ctrl upward by the translation amount ΔV (ΔV2=ΔV), and the second level shifter circuit VDS2 can output the second control signal ctrl_2.

Figure 6:
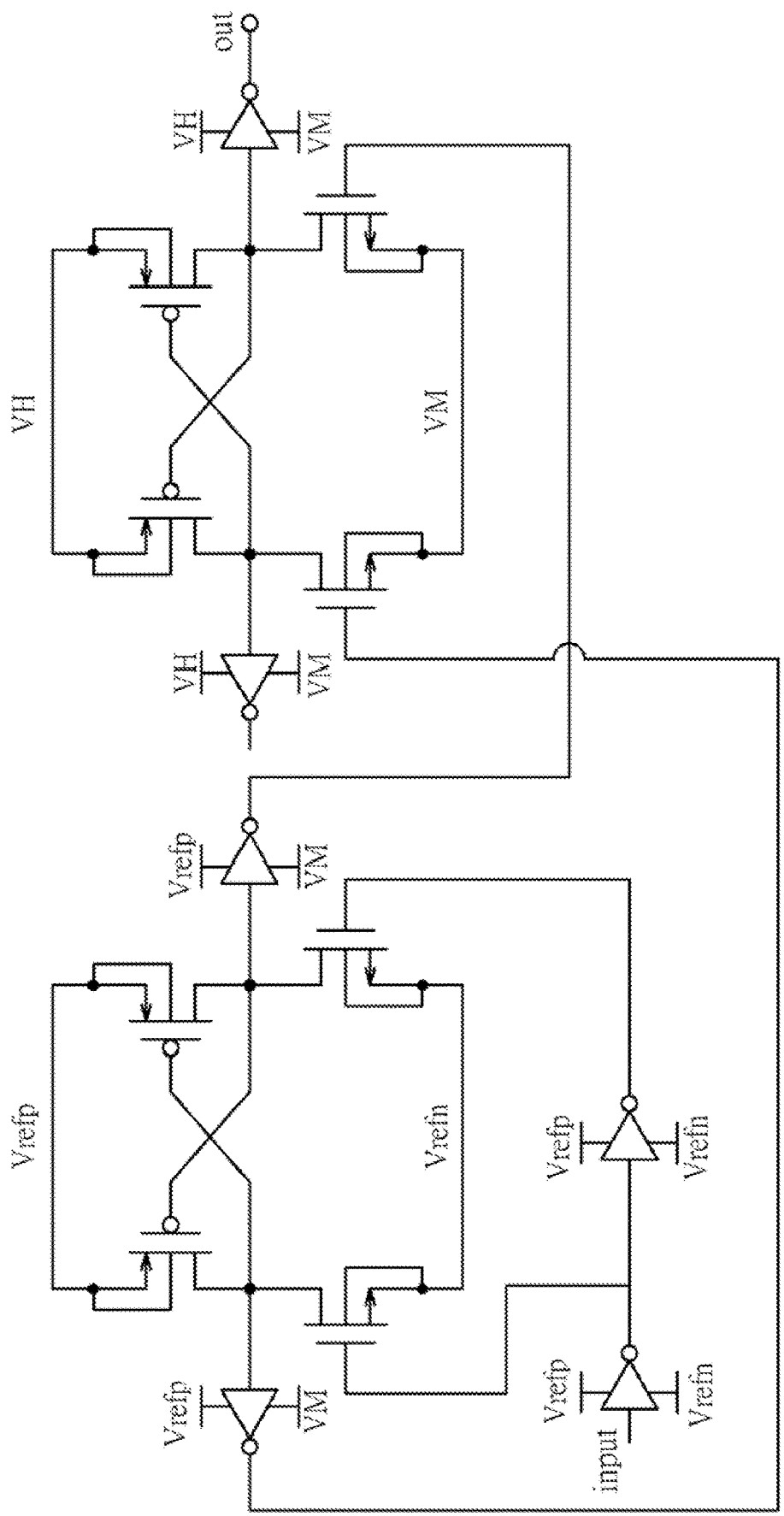
FIG. 6 is a schematic diagram of a voltage level shifter unit according to an embodiment of the present disclosure.
Figure 7:
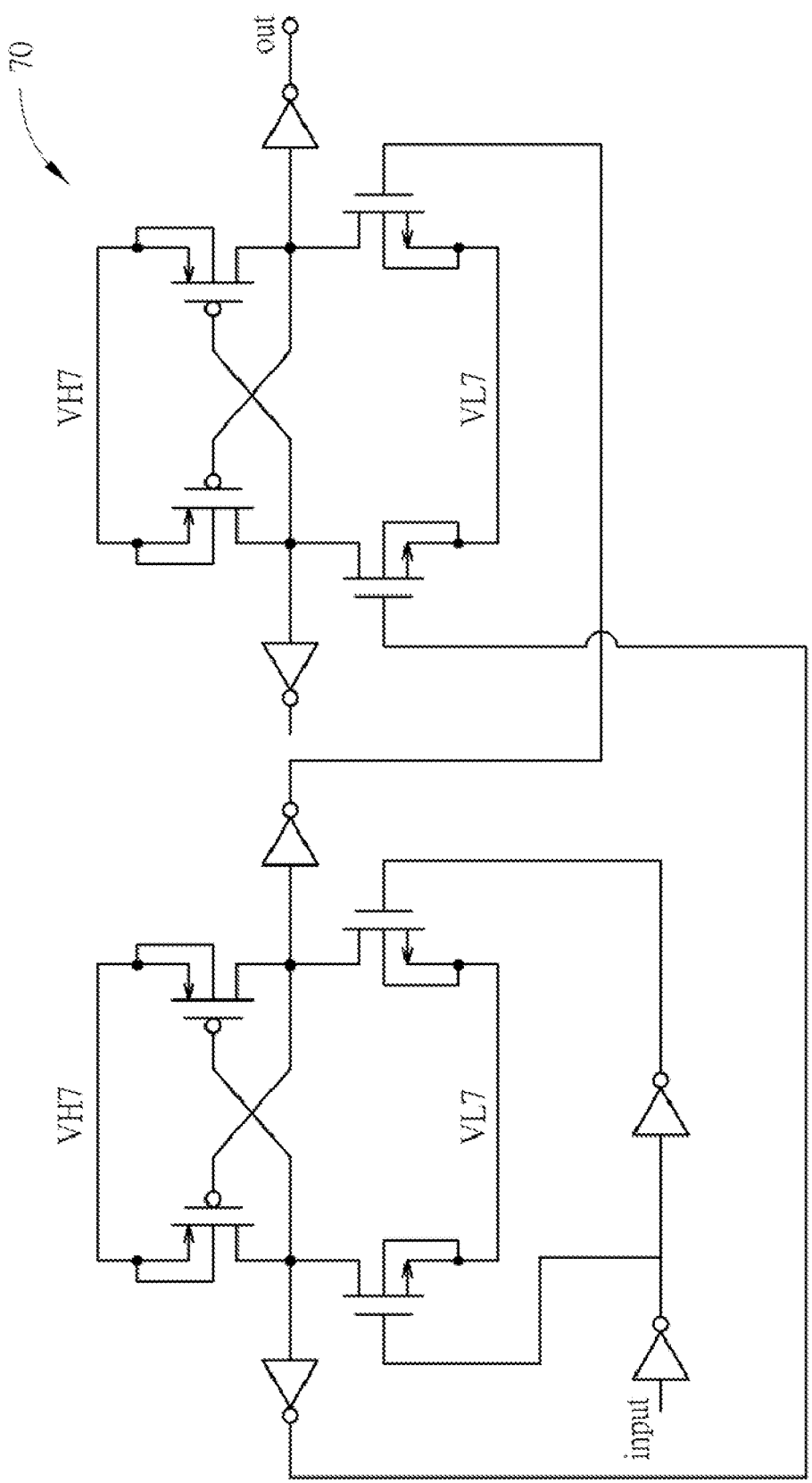
FIG. 7 is a schematic diagram of a dummy level shifter unit according to an embodiment of the present disclosure.

The voltage level shifter units 311, 312, 321 and the dummy level shifter units 322, 331, 332 are not limited to being implemented by specific circuits. For example, reference is made to FIG. 6 and FIG. 7, which are respectively schematic diagrams of a voltage level shifter unit 60 and a dummy level shifter unit 70 according to an embodiment of the present disclosure. The voltage level shifter unit 60 can be used to implement the voltage level shifter units 311, 312, 321, and the dummy level shifter unit 70 can be used to implement the dummy level shifter units 322, 331, 332. In a case that an input signal input of the voltage level shifter unit 60 is between a low voltage VL and an intermediate voltage VM, an output signal out may be generated by the voltage level shifter unit 60, and the output signal out is between an intermediate voltage VM and a high voltage VH. In addition, the voltage level shifter unit 60 may be used for receiving the first reference voltage Vrefp and the second reference voltage Vrefn to bias voltages, wherein the voltages VL, VM, VH, Vrefp and Vrefn have the relationships of VL<Vrefn<VM<Vrefp<VH and VH−VM=VM−VL=Vrefp−Vrefn=ΔV. In addition, in a case that the input signal input of the dummy level shifter unit 70 is between a low voltage VL7 and a high voltage VH7, an output signal out also between the low voltage VL7 and the high voltage VH7 may be generated by the dummy level shifter unit 70. The details of the operation of the voltage level shifter unit 60 and the dummy level shifter unit 70 are well known by those ordinary skilled in the art, and therefore are not repeated herein.

Figure 8:
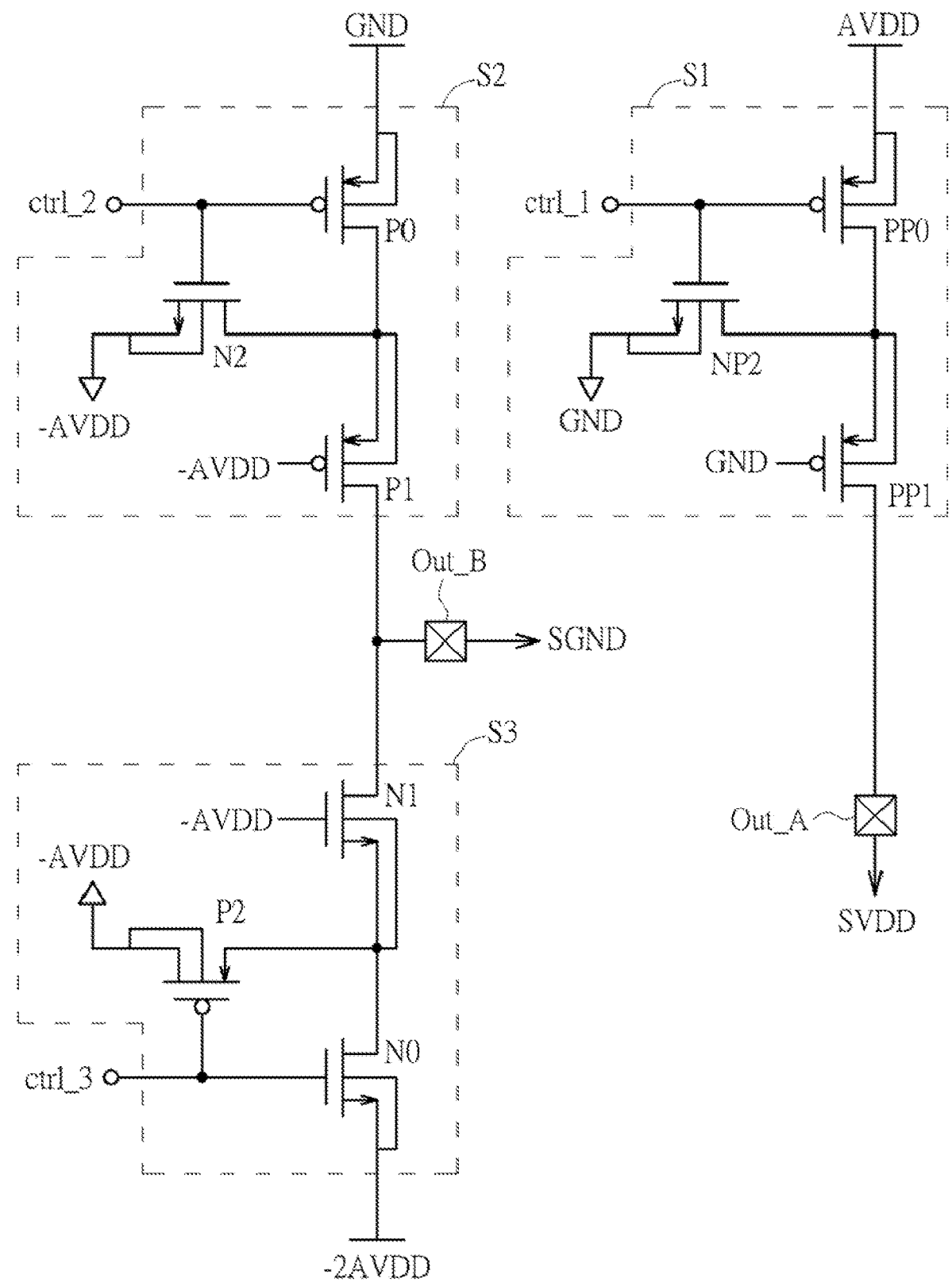
FIG. 8 is a schematic diagram of a plurality of switch modules according to an embodiment of the present disclosure.

In addition, the first switch module S1, the second switch module S2, and the third switch module S3 are not limited to being implemented by specific circuit configurations. For example, reference is made to FIG. 8, which schematic diagrams of the first switch module S1, the second switch module S2, and the third switch module S3 according to an embodiment of the present disclosure. The first switch module S1 includes transistors PP0, PP1, and NP2, wherein the transistors PP0 and PP1 are PMOS transistors, and the transistor NP2 is an NMOS transistor. A source of the transistor PP0 is used for receiving a voltage AVDD, a gate of the transistor PP0 is used for receiving the first control signal ctrl_1, and a drain of the transistor PP0 is coupled to the output terminal Out_A through the transistor PP1. In a case that the first control signal ctrl_1 is at a low electrical potential (the ground voltage GND), the transistors PP0 and PP1 are turned on/ON, and the transistor NP2 is turned off/OFF. In a case that the first control signal ctrl_1 is at a high electrical potential (the voltage AVDD), the transistors PP0 and PP1 are turned off/OFF, and transistor NP2 is turned on/ON. The second switch module S2 includes transistors P0, P1 and N2, where the transistors P0 and P1 are PMOS transistors and the transistor N2 is an NMOS transistor. A source of the transistor P0 is used for receiving the ground voltage GND, a gate of the transistor P0 is used for receiving the second control signal ctrl_2, and a drain of the transistor P0 is coupled to the output terminal Out_B through the transistor P1. In a case that the second control signal ctrl_2 is at a low electrical potential (the ground voltage GND), the transistors P0 and P1 are turned on/ON, and the transistor N2 is turned off/OFF. In a case that the second control signal ctrl_2 is at a high electrical potential (the voltage AVDD), the transistors P0 and P1 are turned off/OFF, and the transistor N2 is turned on/ON. The third switch module S3 includes transistors N0, N1, and P2, where the transistors N0 and N1 are NMOS transistors, and the transistor P2 is a PMOS transistor. A source of the transistor N0 is used for receiving a twice negative voltage −2AVDD, a gate of the transistor N0 is used for receiving the third control signal ctrl_3, and a drain of the transistor N0 is coupled to the output terminal Out_B through the transistor N1. In a case that the third control signal ctrl_3 is at a high electrical potential (the negative voltage −AVDD), the transistors N0 and N1 are turned on/ON, and the transistor P2 is turned off/OFF. In a case that the third control signal ctrl_3 is a low electrical potential (the twice negative voltage −2AVDD), the transistors N0 and N1 are turned off/OFF, and the transistor P2 is turned on/ON. As a result, the floating power signal SVDD and the floating ground signal SGND as shown in FIG. 2 can be generated by the signal generation circuit 304.

As can be seen from the above, in the present disclosure, the signal generation circuits 104, 304 whose component breakdown voltage BV is slightly greater than (or equal to) the voltage AVDD are used to generate the floating power signal SVDD and the floating ground signal SGND each having an amplitude of two times the voltage AVDD. Therefore, the use of the high-voltage process is avoided when manufacturing signal generation circuits (for generating floating power signal and floating ground signal), thus reducing the production cost of the fingerprint identification system. For example, the fingerprint sensing circuit 102 and the signal generation circuit 104 may be manufactured by using the same semiconductor process, and may be configured in a single integrated circuit.

In summary, according to the present disclosure, the signal generation circuit produced by the low-voltage process is used for generating a floating power signal and a floating ground signal each having a high-voltage amplitude to increase the intensity of the fingerprint signal. As compared with the prior art, the present disclosure has the advantage of reducing the production cost.

The above description merely relates to some embodiments of the present disclosure and is not intended to limit the present disclosure. Any change, equivalent substitution, improvements or the like made within the spirit and principles of the present disclosure should be considered as falling within the scope of protection of the present disclosure.

What is claimed is:

1. A fingerprint identification system, comprising:
a fingerprint sensing circuit, having a power supply terminal and a floating ground terminal, the fingerprint sensing circuit being used for generating a fingerprint signal and a first signal, wherein the fingerprint identification system identifies a fingerprint according to the fingerprint signal; and
a signal generation circuit, having a first output terminal and a second output terminal, wherein the first output terminal is coupled to the power supply terminal, and the second output terminal is coupled to the floating ground terminal, and the signal generation circuit is used for generating a floating power signal to the power supply terminal according to the first signal, and for generating a floating ground signal to the floating ground terminal according to the first signal, wherein the floating power signal has a floating power amplitude, and the floating ground signal has a floating ground amplitude;
wherein the signal generation circuit has a breakdown voltage, and both the floating power amplitude and the floating ground amplitude are greater than the breakdown voltage.

2. The fingerprint identification system of claim 1, wherein the signal generation circuit comprises:
an amplitude reduction circuit, coupled to the fingerprint sensing circuit, the amplitude reduction circuit being used for generating a second signal according to the first signal, wherein the first signal has a first amplitude, the second signal has a second amplitude, the second amplitude is less than the first amplitude, and the second amplitude is less than or equal to the breakdown voltage.

3. The fingerprint identification system of claim 2, wherein the signal generation circuit further comprises:
a first level shifter circuit, coupled to the amplitude reduction circuit, the first level shifter circuit being used for translating the second signal by a first translation amount to generate a first control signal;
a second level shifter circuit, coupled to the amplitude reduction circuit, the second level shifter circuit being used for translating the second signal by a second translation amount to generate a second control signal;
a first switch module, a terminal of the first switch module is used for receiving a first voltage, and another terminal of the first switch module is coupled to the first output terminal, wherein the first switch module is controlled by the first control signal;
a second switch module, a terminal of the second switch module is used for receiving a second voltage, and another terminal of the second switch module is coupled to the second output terminal, wherein the second switch module is controlled by the second control signal;

a third switch module, a terminal of the third switch module is used for receiving a third voltage, and another terminal of the third switch module is coupled to the second output terminal, wherein the third switch module is controlled by a third control signal; and a capacitor, coupled between the first output terminal and the second output terminal;

wherein the third control signal is dependent from the second signal.

4. The fingerprint identification system of claim 3, wherein the signal generation circuit further comprises:

a third level shifter circuit, coupled to the amplitude reduction circuit, the third level shifter circuit being used for generating the third control signal according to the second signal.

5. The fingerprint identification system of claim 3, wherein the second signal has a low electrical potential the same as a low electrical potential of the first signal.

6. The fingerprint identification system of claim 3, wherein amplitudes of the first control signal, the second control signal and the third control signal are the same as the second amplitude.

7. The fingerprint identification system of claim 3, wherein at a first time point, the first switch module and the second switch module are turned on, and the floating power signal output by the first output terminal is the first voltage, the floating ground signal output by the second output terminal is the second voltage; and in a second time point, the third switch module is turned on, and the floating ground signal output by the second output terminal is the third voltage.

8. The fingerprint identification system of claim 3, wherein the third voltage is negative two times the first voltage, and the second voltage is a ground voltage.

9. The fingerprint identification system of claim 2, wherein the amplitude reduction circuit comprises:

a plurality of transistors, serially connected into a transistor sequence, wherein a first terminal of the transistor sequence is used for receiving the first signal, and a second terminal of the transistor sequence is used for outputting the second signal; and a resistor, coupled to the second terminal of the transistor sequence.

10. The fingerprint identification system of claim 2, wherein the amplitude reduction circuit comprises:

a plurality of diodes, serially connected into a diode sequence, wherein a first terminal of the diode sequence is used for receiving the first signal, and a second terminal of the diode sequence is used for outputting the second signal; and a resistor, coupled to the second terminal of the diode sequence.

11. The fingerprint identification system of claim 3, wherein the first level shifter circuit comprises a first voltage level shifter unit and a second voltage level shifter unit, the first voltage level shifter unit is used for translating the second signal upward by a third translation amount to generate a third signal, and the second voltage level shifter unit is used for translating the third signal upward by the third translation amount, and the third translation amount is identical to the second amplitude.

12. The fingerprint identification system of claim 3, wherein the second level shifter circuit comprises a third voltage level shifter unit, the third voltage level shifter unit is used for translating the second signal upward by the second translation amount, and the second translation amount is identical to the second amplitude.

13. The fingerprint identification system of claim 12, wherein the second level shifter circuit further comprises a first dummy level shifter unit coupled to the third voltage level shifter unit.

14. The fingerprint identification system of claim 4, wherein the third level shifter circuit comprises a second dummy level shifter unit and a third dummy level shifter unit, the second dummy level shifter unit is used for receiving the second signal, the third dummy level shifter unit is used for outputting the third control signal, the second signal has the same high electrical potential as that of the third control signal, and the second signal has the same low electrical potential as that of the third control signal.

15. The fingerprint identification system of claim 1, wherein the first signal is the floating power signal at a first time point, and the first signal is the floating ground signal at a second time point.

16. The fingerprint identification system of claim 1, wherein a fixed voltage difference is between the floating power signal and the floating ground signal.

* * * * *